(12) United States Patent
Frenkil

(10) Patent No.: US 7,117,457 B2
(45) Date of Patent: Oct. 3, 2006

(54) CURRENT SCHEDULING SYSTEM AND METHOD FOR OPTIMIZING MULTI-THRESHOLD CMOS DESIGNS

(75) Inventor: Gerald L. Frenkil, Concord, MA (US)

(73) Assignee: Sequence Design, Inc., Santa Clara, CA (US)

( * ) Notice: Subject to any disclaimer, the term of this patent is extended or adjusted under 35 U.S.C. 154(b) by 226 days.

(21) Appl. No.: 10/739,659

(22) Filed: Dec. 17, 2003

(65) Prior Publication Data
US 2005/0138588 A1  Jun. 23, 2005

(51) Int. Cl.
G06F 17/50 (2006.01)

(52) U.S. Cl. .................. 716/2; 716/6; 716/10

(58) Field of Classification Search ........... 716/2–15; 327/200–212; 703/13–20; 326/56–126
See application file for complete search history.

(56) References Cited

U.S. PATENT DOCUMENTS

| | | | |
|---|---|---|---|
| 6,794,614 B1* | 9/2004 | Taniguchi et al. | 219/270 |
| 6,832,361 B1* | 12/2004 | Cohn et al. | 716/6 |
| 6,850,103 B1* | 2/2005 | Ikeno et al. | 327/202 |
| 7,007,256 B1* | 2/2006 | Sarkar et al. | 716/6 |
| 2003/0212538 A1* | 11/2003 | Lin et al. | 703/14 |

* cited by examiner

Primary Examiner—Vuthe Siek
Assistant Examiner—Nghia M. Doan
(74) Attorney, Agent, or Firm—Edward C. Kwok; MacPherson Kwok Chen & Heid LLP

(57) ABSTRACT

This invention provides a mechanism for minimizing the switching time degradation of MTCMOS circuits while at the same time minimizing the area overhead due to the MTCMOS switch circuitry. This optimization is achieved by scheduling the current flow, due to the switching events of the MTCMOS logic cells, such that only temporally mutually exclusive currents, or currents whose cumulative sum is less than a predetermined value, can flow in any given switch cell. Techniques for current event merging and current event culling, and techniques for handling timing and current variances may be used.

54 Claims, 4 Drawing Sheets

CURRENT SCHEDULING SYSTEM AND METHOD FOR OPTIMIZING MULTI-THRESHOLD CMOS DESIGNS

BACKGROUND OF THE INVENTION

1. Field of the Invention

The present invention relates to an integrated circuit design automation system for designing power-efficient integrated circuits. In particular, the present invention relates to a method used in conjunction with an integrated circuit design automation system that optimizes a power-efficient integrated circuit design by connecting appropriately placed and sized power-gated devices.

2. Discussion of the Related Art

In the advanced fabrication processes developed recently, the size of leakage currents[1] has increased substantially over that of previous fabrication processes. Large leakage currents are detrimental in particular to battery-operated devices, such as cellular telephones and other wireless devices, which spend a substantial amount of time under stand-by operation conditions. To reduce power consumption during stand-by operations, many design techniques have been developed to minimize leakage current in an integrated circuit. One such technique, for example, is the "power-gating" technique, which is applicable to multi-threshold CMOS ("MTCMOS") circuits. An MTCMOS circuit includes transistors of different threshold voltages. Specifically, the higher threshold PMOS and NMOS transistors are used as "switch" or "sleep" transistors, each of which selectively connects or disconnects its associated physical power supply (i.e., the power supply voltage or the ground reference voltage for the integrated circuit) to and from its associated CMOS logic circuits, which are built out of lower threshold voltage transistors for higher performance. (The physical power supplies are also referred to as primary or global power supplies.) In that application, the CMOS logic circuits are each connected in series to the ground reference voltage by one or more NMOS transistors and to the power supply voltage by one or more PMOS transistors. The voltage at a source terminal of a switch transistor is referred to as a "virtual power supply" to distinguish it from the physical power supplies of the integrated circuit. While this circuit configuration significantly reduces leakage currents, power-gating presents design challenges not seen in non-power gated integrated circuit designs. One challenge, for example, relates to the area overhead introduced by the switch transistors. Another challenge relates to the electrical effects introduced by the connecting logic circuit in series with switch transistors.

[1] A leakage current is the actual current load in a device when the device is in the non-conducting state.

To minimize area overhead, switch transistors are often shared among multiple MTCMOS logic cells. While sharing switch transistors reduces silicon area, significant timing issues may arise that require extensive timing analysis and delay calculation to ensure proper operation. The timing issues result from the switching time degradation in a CMOS logic circuit when the CMOS logic circuit is powered through a switch transistor connecting it to the ground reference (i.e., the effective resistance to ground seen by the discharging load capacitor is increased). The extent of the switching time degradation depends on both the size of the switch transistor and the current in the switch transistor when the logic circuit switches. Thus, it is desirable to minimize both the resistance and the current in the switch transistor. Reducing the number of logic circuit transistors sharing a switch transistor reduces switching time degradation, but increases silicon area.

There is thus a need for a design method that maximizes switch transistor sharing while simultaneously avoiding switching time degradation.

SUMMARY OF THE INVENTION

The present invention provides an integrated circuit design system that receives a placed MTCMOS design, sizes switch transistors to minimize performance and area penalties, inserts additional or deletes unnecessary switch transistors as required for optimal switch sharing, and produces as output a fully placed, electrically correct, optimized design. The present invention thus establishes the degree and the extent of sharing between switch transistors and logic transistors.

According to one embodiment of the present invention, a current scheduling technique maximizes switch transistor sharing without incurring a significant penalty in switching time degradation. The current scheduling technique assigns a switch transistor to a group of MTCMOS logic cells that exhibits substantially mutually exclusive switching behavior. Alternatively, mutually exclusive switching within a group is not required, provided that the sum of currents overlapping in time does not exceed a predetermined value at any given time. Grouping of MTCMOS cells may be accomplished using a timing analysis of the switching events. Each switch transistor is assigned MTCMOS logic cells according to the switching current of the MTCMOS logic cells such that, during any timing interval (e.g., a timing window, discussed below), the total switching current in the MTCMOS cells associated with the switch transistor is less than a predetermined limit established for that switch transistor.

In one embodiment of the present invention, a method for optimizing a power-gated design divides any specified timing interval (e.g., a clock period) into a selected number of timing windows. The method analyzes, for each logic element in the power-gated design, the timing of current events corresponding to state transitions in the logic element. Each current event is then mapped to the corresponding timing window during which the state transition occurs. The power-gated design is then provided switch devices intended to couple virtual power supplies for the logic elements to the physical power supplies. In one embodiment, each switch device has one terminal coupled to a physical power supply, a second terminal coupled to provide a virtual power supply, and a third terminal receiving a control signal that enables a low impedance path between the first terminal and the second terminal. The method then assigns each logic element of the power-gated design to a switch device according to the mapping of current events in each element to the timing windows; and routes the elements of the power-gated design to the switch devices according to the assignment of the assigning step. In one embodiment, the number of current events associated with elements assigned to each switch device within each timing window is less than a predetermined number. In one instance, that predetermined number is one (i.e., elements assigned to each switch device do not switch simultaneously). The power-gated design can be divided into power domains and sub-domains to facilitate local optimization.

According to one embodiment of the present invention, current event merging and culling techniques are applied.

According to one embodiment of the present invention, on-chip variations are taken into consideration using techniques that provide for timing and current variations.

In one embodiment, elements are assigned to each switch device such that the switch cell has a current less than a predetermined maximum in each timing window. Alternatively, elements may be assigned to the switch device such that a voltage drop across the low impedance path in the conducting switch device is less than a predetermined value. The switch devices may be selected from a collection of switch devices each capable of handling a different maximum current.

To further optimize the power-gated design, switch circuits can be sized and resized, and their associations with the circuit elements of the power-gated design changed such that the number of elements assigned to each switch device is increased (i.e., further switch device sharing), without corresponding significant changes to switching performance of the power-gated design. Performance effects of the switch devices can be estimated using static timing analysis techniques, applied using wire models or extracted parasitic capacitances of interconnect conductors available after routing.

The method of the present invention is applicable to a system in which the elements of the logic circuit and the switch devices are standard cells of predetermined cell heights to allow optimal placement and routing using conventional place and route techniques. Thus, the present invention can be readily incorporated into existing design automation systems. In one embodiment, the elements of the logic circuit and the switch devices comprise transistors of different threshold voltages. Higher threshold devices are used in switch cells to reduce leakage, and lower threshold devices are used in the logic elements to enhance switching performance.

The present invention is better understood upon consideration of the detailed description below in conjunction with the accompanying drawings.

BRIEF DESCRIPTION OF THE DRAWINGS

To facilitate cross-reference among the figures, like elements are assigned like reference numerals.

DETAILED DESCRIPTION OF THE PREFERRED EMBODIMENTS

Figure 1:
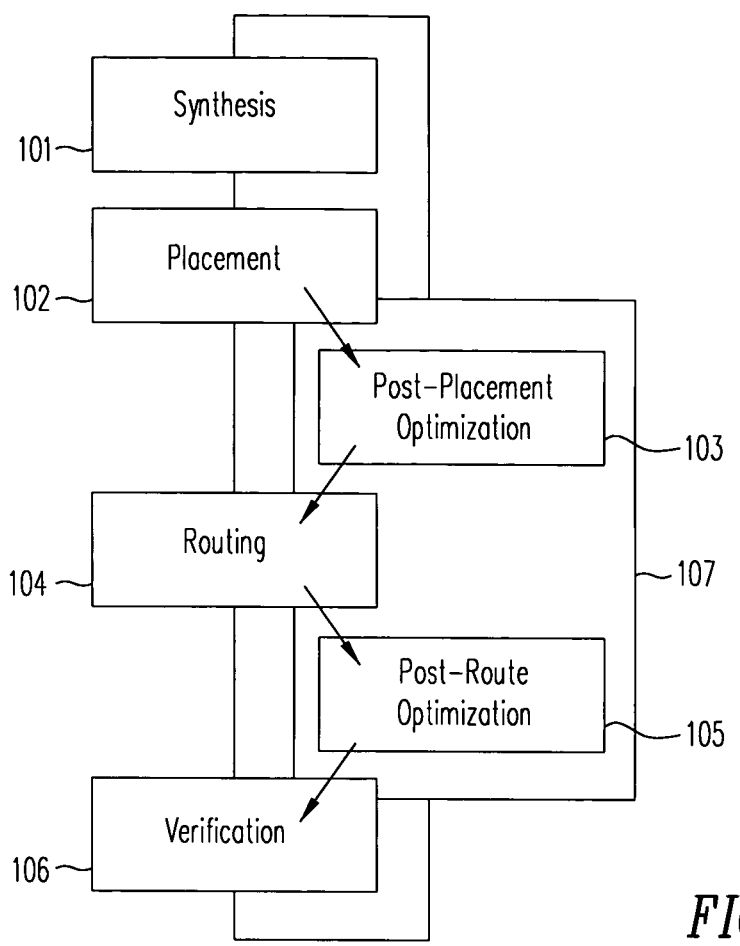
FIG. 1 shows a design flow used in one exemplary design automation system suitable for implementing the present invention.

The present invention is applicable to use, for example, in a design automation system, such as the Physical Studio design automation system available from Sequence Design Inc. Typically, such a design automation system may include a toolset that concurrently predicts and corrects timing and signal integrity. Typically, such a toolset can be used both before and after routing. In addition, such a design automation system may include capabilities for delay calculation, noise analysis, static timing analysis (STA), placement-aware timing optimization, and placement-aware noise optimization. One exemplary design automation system has a design flow illustrated in FIG. 1. As shown in FIG. 1, an integrated circuit described in a high-level circuit description language (e.g., a register transfer level (RTL) description) can be synthesized in synthesis step 101 into a logic netlist described at the cell level. Placement step 102 associates the cells in the logic netlist with physical locations in the intended integrated circuit implementation. Post-placement optimization step 103 optimizes the intended integrated circuit implementation by modifying the placed circuit using, for example, estimated wire lengths. As described below, the present invention may perform partitioning of the placed circuit into power domains and may introduce switch cells into the placed circuit, for example, at post-placement optimization step 103. The post-placement optimized circuit is then routed by routing step 104. Post-route optimization step 105 performs further circuit optimization using, for example, extracted parasitic wiring capacitances. According to the present invention, as described below, sizing, insertion and deletion of switch cells may be performed both prior to and after routing (e.g., during post-route optimization step 105) to achieve further optimization. Verification step 106 verifies correctness of the design according to silicon area, timing, power dissipation and other performance criteria. In one embodiment, design automation system 107, which performs post-placement and post-route optimization steps 103 and 105, may be implemented separately from synthesis step 105, placement step 102, routing step 104 and verification step 106.

According to one method of the present invention, switch transistors (e.g., transistors provided in "switch cells") are inserted into the design of an integrated circuit to connect one or more multi-threshold CMOS ("MTCMOS") logic cells to the power or ground supply voltages. The present invention is illustrated below by an embodiment that applies a current scheduling method at the "cell" level. In other words, in this embodiment, circuit elements are provided and manipulated as design cells according to a standard cell design methodology. (The current scheduling method of the present invention, however, can also be applied in other design systems at the transistor level, rather than at the cell level.) In a cell based design system, cells are typically placed and connected by abutment in rows along one dimension of the integrated circuit. In this embodiment, each switch cell has three terminals, for connections to a physical power supply, to a virtual power supply, and to a terminal carrying a sleep control signal, respectively. (The sleep control signal controls the conducting and non-conducting states of the switch transistor.) Under this arrangement, logic circuit elements coupled to the same virtual power supply form one power or "sleep" domain. Those logic circuit elements that are directly coupled to a physical power supply, and not through a switch cell, form another power domain.

Current scheduling, as used in the discussion herein, refers to the current event-based method by which MTCMOS cells are assigned to a virtual supply terminal of a switch cell. By design, current scheduling limits the maximum current that flows in a virtual power supply, and sizes the switch cell or cells coupled to the virtual power supply accordingly. As discussed below, proper application of current scheduling reduces standby mode leakage currents by dynamically enabling and disabling the virtual power supply of a power domain, without adversely affecting overall device timing performance. Further optimizations that minimize total chip area, dynamic power, and overall design time are possible.

Figure 2:
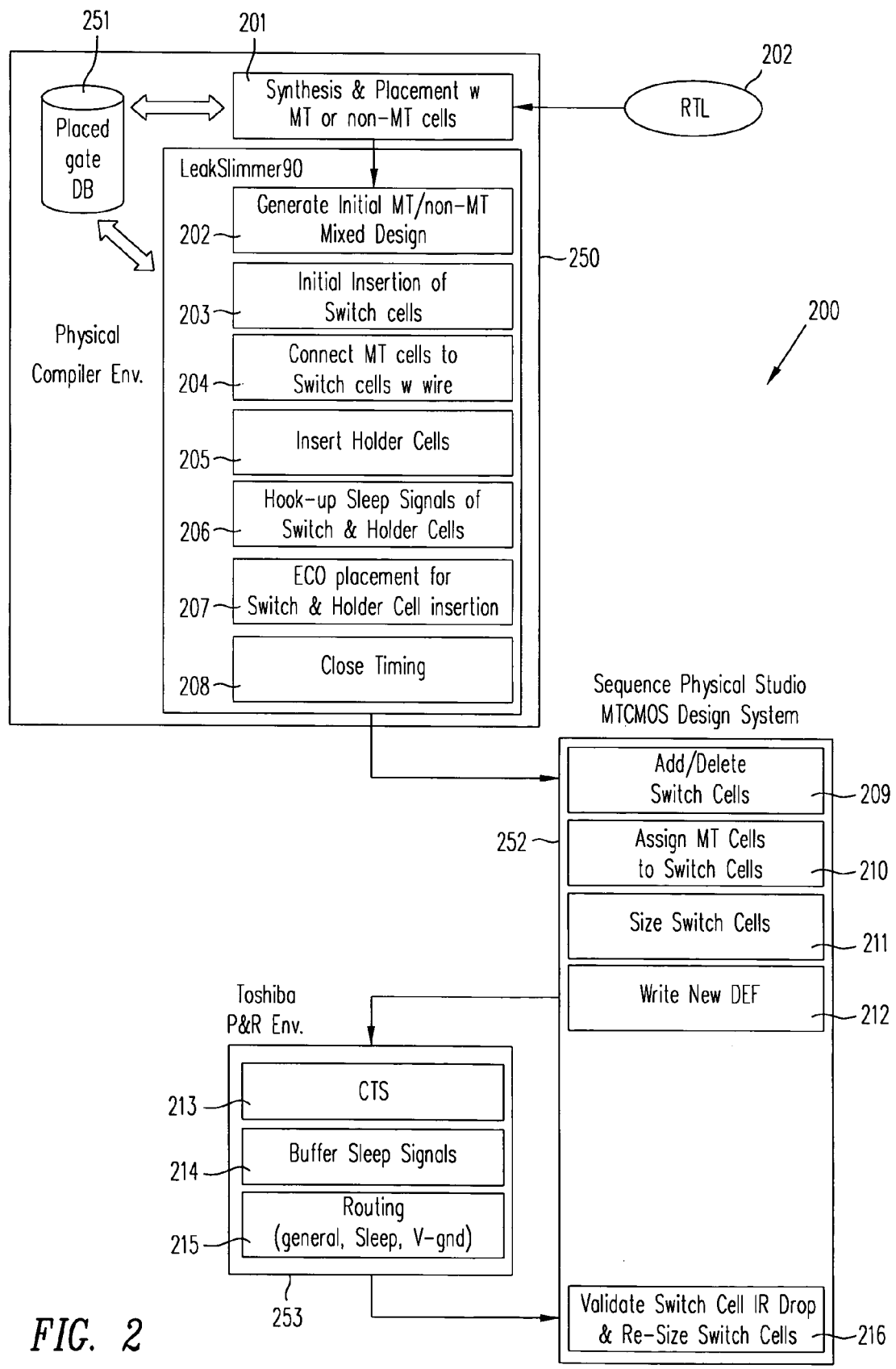
FIG. 2 illustrates one embodiment of the present invention in MTCMOS design system 200.

FIG. 2 illustrates one embodiment of the present invention in MTCMOS design system 200 in greater detail than is shown in FIG. 1. As shown in FIG. 2, a design description (e.g., an RTL or gate level description) is provided at step 202 to logical design environment 250, which partitions the design into sleep domains and synthesizes a physical design ("mixed design") corresponding to the design description, using MTCMOS and non-MTCMOS cells from one or more cell libraries 251 (not shown). The necessary switch cells are then inserted and connected to the mixed design (step 203). A sleep controller, which includes the necessary logic circuits and sleep control signals to control the switch cells, is then connected to the switch cells (step 204). The sleep control signals may be appropriately buffered, as the total capacitive load presented by the switch cells in a sleep domain can be substantial. The entire mixed design, including the functional circuit, the switch cells and the switch controller, is then placed (step 205). Switch cells are preferably placed in close physical proximity to their attached MTCMOS cells.

Cell libraries 251 include an MTCMOS logic standard cell library, which are logic standard cells that can be power-gated. In the physical designs of some conventional standard cell libraries, particularly those using well-taps and substrate contacts, the cells in the MTCMOS logic standard cell library do not tie the source terminals of the NMOS or PMOS transistors to the substrate or a P-well. Cell libraries 251 may include also a collection of switch cells of various transistor sizes, each suitable for supporting a predetermined number of MTCMOS logic cells. The switch cells are associated with fan-out rules that are developed to facilitate the assignment of switch cells to the appropriate number of MTCMOS logic cells the switch cell is to support. The fan-out may be specified, for example, according to the current the switch cell can sink or source. In addition, cell libraries 251 also include a collection of holder cells suitable for use as pull-up transistors, pull-down transistors, or half-latch logic state keepers. Holder cells are required to provide an MTCMOS output signal to a non-MTCMOS input terminal. In one embodiment, a mechanism is provided to tag switch cells and holder cells, such that other tools can recognize these switch and holder cells. The cells in the MTCMOS, the non-MTCMOS cell libraries, and the switch and holder cells can be provided in conventional standard cell layout formats. The power and timing models in each of these libraries and the switch and holder cells can also be provided in conventional power and timing model formats.

At step 206, holder cells are inserted into the mixed design. At step 207, switch cells are added or deleted by a switch cell insertion or deletion module according to a switch cell optimization method, such as the current scheduling method described below. MTCMOS logic cells are then assigned to the switch cells (step 208). A switch cell assignment module can be provided that selects MTCMOS logic cells to be associated with each switch cell by connecting the source terminal of each selected logic cell to the drain terminal of the associated switch cell. The MTCMOS cells are grouped with the goal of minimizing the amount of current during simultaneous switching, thereby minimizing both the instantaneous currents in the switch cell at any given time, and the delays due to voltage drop on a virtual power supply line. In one embodiment, the logic cells in the group do not switch simultaneously. In another embodiment, the logic cells in the group may switch simultaneously, provided that the sum of the switching currents does not exceed a predetermined value within a given time interval (e.g., a timing window, discussed below).

An initial switch cell sizing is then carried out based on the current requirements of the MTCMOS cells assigned (step 209). A switch cell-sizing module may be provided that sizes each sleep cell to achieve appropriate timing performance. This sizing module can be designed for use both pre-route and post-route. (In conjunction with the switch cell insertion and deletion module, the switch cell-sizing module resizes switch cells, when necessary, based upon a current analysis.) According to one embodiment of the present invention, a set of switch cell sizing rules is provided. These sizing rules may specify, for example, the maximum current for each switch cell, and the maximum voltage drop across the virtual power supply terminal and the physical power supply terminal of each switch cell. In one embodiment, the on-resistance of each switch cell is also provided.

Based on this initial switch cell sizing, connections between the switch cells and MTCMOS logic circuits may be reconfigured, as required for optimal cell sharing. Switch cells are sized and re-sized optimally based upon the initial netlist and the placement, using estimated wiring parasitic impedances ("parasitics") to calculate the voltage drop across the virtual supply and the physical supply terminals of the switch cell instance. This reconfiguration may require adding or deleting of switch cells. At step 210, buffers are inserted where sleep control signals must drive large capacitive loads. A clock tree synthesis (CTS) step 211 is performed. At step 212, a static timing analysis updates delays for the purposes of evaluating timing performance against specified timing constraints. If the constraints are violated, timing optimization steps are performed to meet the constraints (otherwise known as timing closure). Once timing closure is achieved, a Verilog netlist and pre-route file in a conventional format (e.g., DEF) is then created (step 213). The design is then provided to routing environment 253.

In routing environment 253, routing of the logic circuits, sleep control signals and the virtual power supplies are then carried out at step 214. After routing step 214, the routed design is returned to design automation system 252. At step 215, the drop in voltage in each switch cell instance across its virtual ground terminal and its associated physical power supply terminal is analyzed. A voltage drop and current module can be provided that estimates a voltage drop across a conducting switch cell or the current in the switch cell. Where required to limit the virtual power supplies to voltages within its specification, the switch cells are re-scheduled and re-optimized. MTCMOS sizing rule violations may be detected from a current estimate calculated during the voltage drop analysis. The switch cell re-optimization may involve inserting, deleting, re-scheduling or re-sizing individual switch cell instances.

In one embodiment, the physical design of the MTCMOS cells and the switch cells are physically compatible with non-MTCMOS standard cells for the purpose of placement and routing in conventional standard cell designs. That is, the cell heights and locations of the primary power and ground supplies in the MTCMOS cells are designed to be identical to the non-MTCMOS cells. With this design, each row of an integrated circuit can be a mixture of MTCMOS and non-MTCMOS cells. A row may also be homogeneous—all MTCMOS or all non-MTCMOS—although this is not shown here. In addition, the virtual power supply (i.e., either power or ground) of an MTCMOS cell is brought out to the cell boundary as a routing signal, such as illustrated by cells 301 and 302 of FIG. 3.

Figure 3:
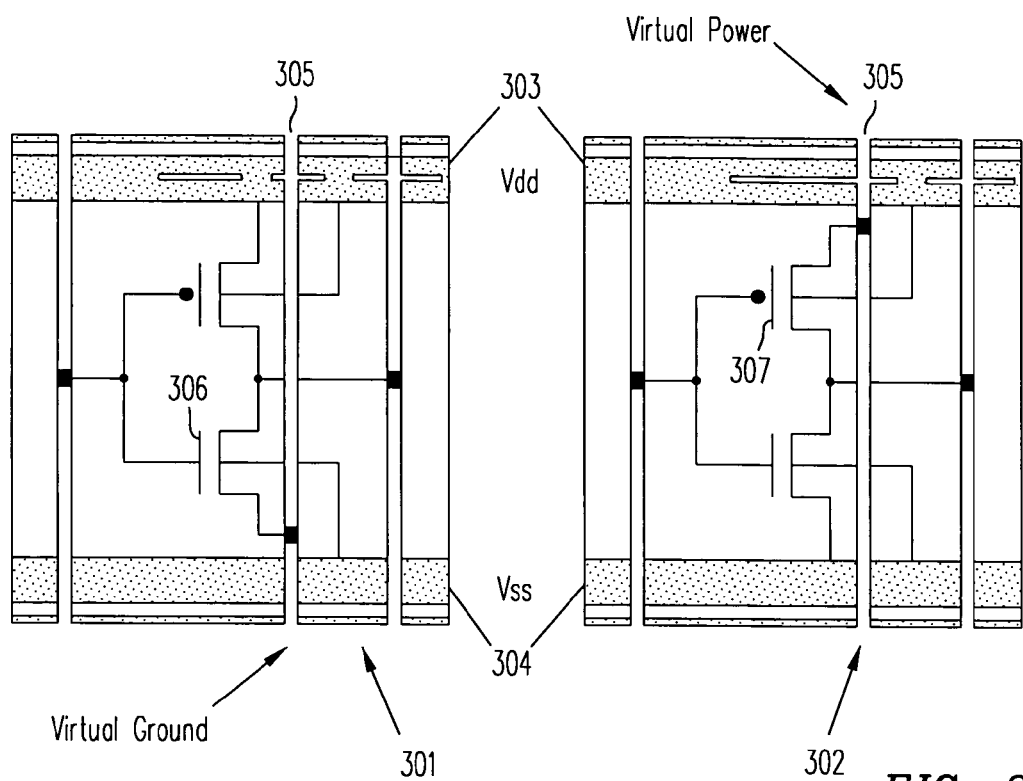
FIG. 3 illustrates MTCMOS logic cells 301 and 302 each having a virtual power supply (i.e., either power or ground) brought out to the cell boundary as a routing signal.
Figure 4:
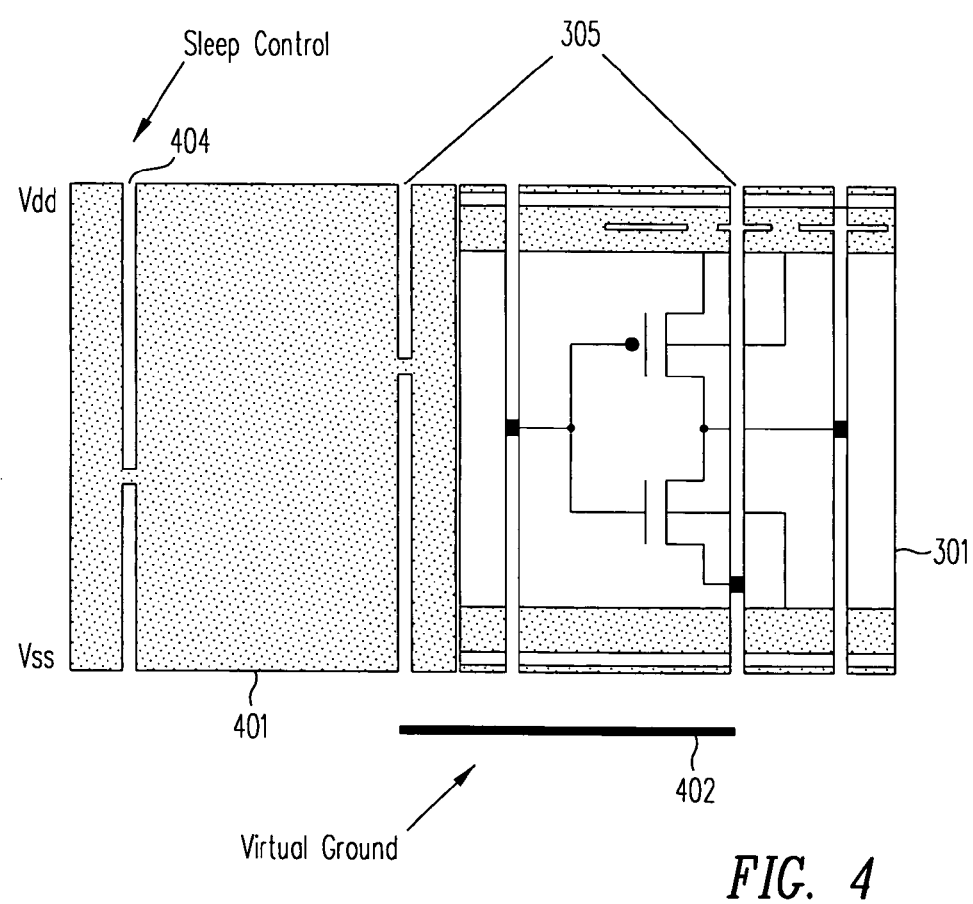
FIG. 4 shows conductor 305 of MTCMOS logic cell 301 being routed to the virtual ground terminal of switch cell 401.
Figure 5:
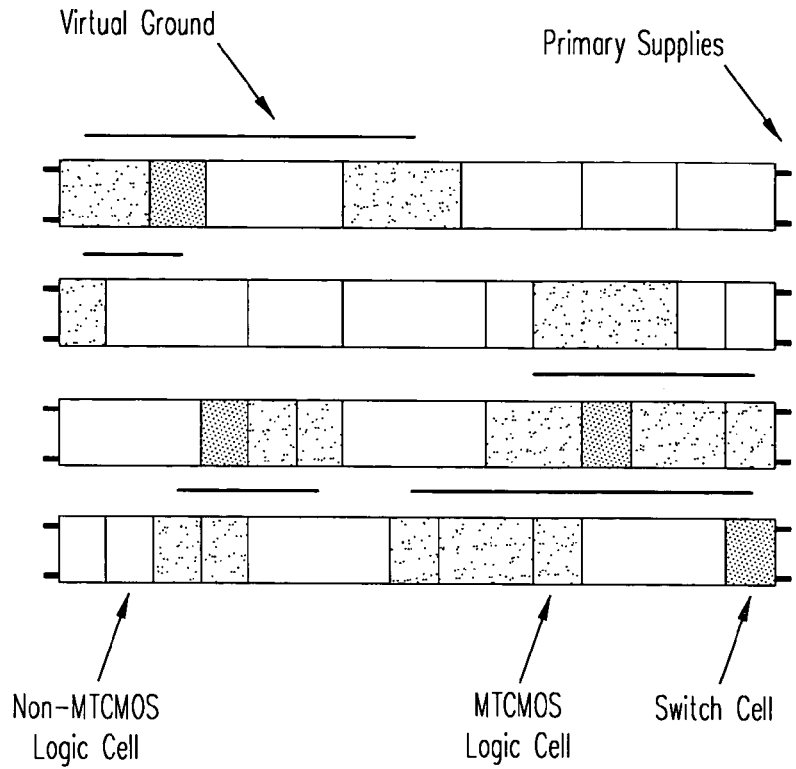
FIG. 5 shows that, in a standard cell design using MTCMOS logic cells, each row may have none, one or more switch cells, and the switch cells can be placed anywhere in a row.

As shown in FIG. 3, each of MTCMOS cells 301 and 302 is provided conductors within the cell for connecting to physical power supplies 303 and 304 (labeled Vdd and Vss, respectively) by abutment, as is common in standard cell layout and placement. MTCMOS cell 301, however has the source terminal of transistor 306 connected not to physical ground reference 304, but conductor 305, which is treated by the routing software as a signal line. In a routing step, conductor 305 is routed to the virtual power supply terminal of a switch cell, such as shown in FIG. 4. As shown in FIG. 4, switch cell 401 is shown placed in a row of standard cells adjacent to MTCMOS cell 301. (Each row may have none, one or more switch cells, and the switch cells can be placed anywhere in a row, as illustrated in FIG. 5). The routing step provides conductor 402 in a routing region, which connects conductor 305 of MTCMOS cell 301 to corresponding conductor 305 of switch cell 401. Although shown here as serving an MTCMOS cell within the same row, switch cells may be used to serve MTCMOS cells in different rows. In FIG. 4, sleep control signal 403 for switch cell 401 is routed through conductor 404. Referring back to FIG. 3, MTCMOS cell 302 has a source terminal of PMOS transistor 307 being connected, not to physical power supply 303, but to conductor 305. Conductor 308 of MTCMOS cell 302 is to be routed to share a common virtual power supply. In this embodiment, the placement architecture may be conventional row-based placement, with channel or channel-less routing.

As switch cells are inserted and deleted during both pre-route and post-route placement operations to obtain a reasonable sharing of switch cells among MTCMOS logic cells, performance degradation is possible where multiple MTCMOS logic cells sharing the same switch cell switch simultaneously. In order to minimize any performance degradation due to the use of shared switch cells, it is essential to limit the current flowing in each virtual power supply. By judiciously selecting the MTCMOS logic cells that are to connect to a given virtual power supply terminal of a switch cell, the maximum current in each virtual power supply can be limited.

Figure 7:
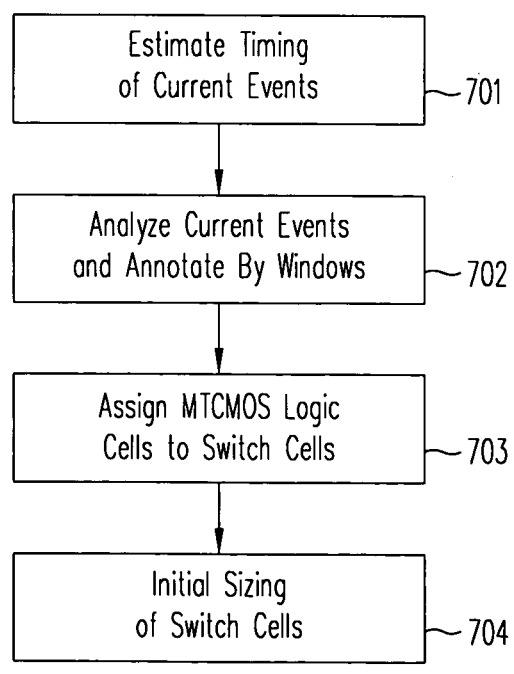
FIG. 7 illustrates a current scheduling method, in accordance with one embodiment of the present invention.
Figure 6:
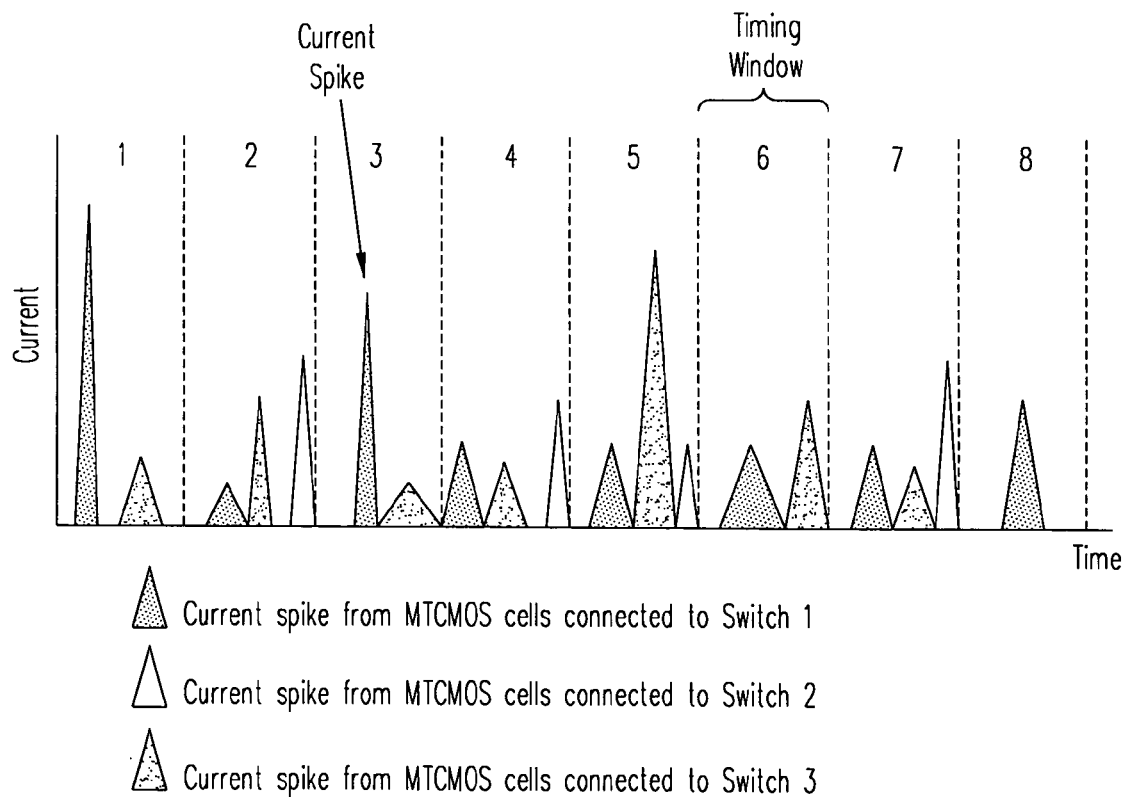
FIG. 6 illustrates a current scheduling method, in accordance with one embodiment of the present invention.

In one embodiment of the present invention, illustrated by FIGS. 6 and 7, a current scheduling method first estimates the timing of current events for each MTCMOS logic cell relative to the beginning of a specified time interval, such as a clock cycle (FIG. 7, step 701), which is divided into a predetermined number of windows. In FIG. 6, for illustrative purpose, eight windows are shown. A current scheduling method of the present invention is applicable to any number of windows (e.g., 32 windows). Current scheduling can be accomplished by, for example, a vectorless current approximation based on vectorless information. Under one such method, currents are estimated for the various possible events for each logic cell. Timing window techniques provide greater timing granularity than conventional static timing analysis that merely provides best/worst case timing using unit delays. Vectorless techniques are used to find all possible events. One example of the vectorless techniques is illustrated in copending patent application, entitled "Vectorless Instantaneous Current Estimation," Ser. No. 10/262,914, filed on Oct. 1, 2002, in which the logic elements of a circuit are conditioned such that not all of the logic elements are predicted to transition in the same direction at the same time, thus avoiding an overestimation of the instantaneous current spikes. The scheduling method can accommodate multiple asynchronous clock domains by, for example, scheduling switching currents on a clock domain by clock domain basis.

The present invention also uses event merging and event culling techniques. Typically, a static timing analysis provides a complete list of all events that can possibly occur, along with the timing of their occurrences. Event merging and event culling reduce the conservatism or pessimism inherent in the estimation by considering only the effects of those events that are of interest to a given application. Event merging and culling prevents unrealistically high estimates of currents, for example, thereby avoiding excessive conservatism.

Event merging combines events that are scheduled to occur at nearly the same time into a single event to avoid "double counting". For example, in one application, a "merge window" parameter is defined to be 0.002 ns. In that application, at an input terminal of an inverter, two transitions in the same direction within the merge window (e.g., at 1.000 ns and 1.001 ns, respectively) are merged into a single event.

Event culling removes from consideration those events that are irrelevant with respect to a given application, or those events that cannot occur simultaneously as other events of interest. For example, at an inverter's output terminal, a low-to-high transition and a high-to-low transition cannot simultaneously occur, even though predicted by a static timing analyzer based on signal transitions from different upstream signals. If the application analyzes ground currents, for example, the low-to-high transitions would be removed from the analysis, since the high-to-low transition would result in a more significant and relevant ground current. Consistent with the inverter's output condition, the corresponding high-to-low signal transition at the output of the upstream cell driving this inverter (i.e., the high-to-low signal transition at the input terminal of the inverter) is removed.

Referring to FIG. 7, at step 702, the current events for each of the MTCMOS logic cells are then analyzed, and each MTCMOS logic cell is annotated with the windows within which a current event occurs for that MTCMOS logic cell. After the current events for all MTCMOS logic cells are analyzed, at step 703 each MTCMOS logic cell is assigned to a switch cell such that each switch cell sinks no more than a specified amount of current in each of the windows within a clock cycle. For example, FIG. 6 shows the current events of three switch cells. In FIG. 6, switch cell 1 is assigned MTCMOS logic cells that include current events in all windows, switch cell 2 is assigned MTCMOS logic cells that include current events in windows 2, 4–5 and 7, and switch cell 3 is assigned MTCMOS logic cells that include current events in windows 1–7. In this particular example, however, none of the three switches are assigned more than one current event in each window.

In one embodiment, the current events are also analyzed taking into account timing variations among logic cells due to on-chip process variations (OCV). OCV represents electrical characteristic variations in the integrated circuit due to variation in the manufacturing process. For example, two logic cells that switch in adjacent timing windows under typical process conditions may switch in the same timing window under a "fast" process condition. Also, two elements (e.g., transistor or wire segment) designed to have identical parameter values, when manufactured, may actually have slightly different parameter values due to OCV. For an MTCMOS design tool, OCV presents at least two issues. First, the calculated currents have variances associated with them. Second, and more significantly, the switching times of the calculated currents also have variances associated with them. In current scheduling, since switching times are used to determine the extent of switching exclusivity, accounting for OCV improves the effectiveness of the design tool.

According to one embodiment of the present invention, current scheduling may take both timing and current variances OCV into consideration. Timing variances may be accounted for under many different techniques. Without consideration of timing variances, each event occupies a single timing bin. To accommodate timing variances, one technique under the present invention places an event not only in the target bin, but also in non-overlapping bins adjacent to the target bin. This technique prevents too many events from being scheduled in any timing bin when the actual arrival times of the event may occur much sooner or later than the calculated time, due to the inherent timing uncertainties. The number of adjacent bins to use depends on both the width of each timing bin and the uncertainty associated with the event under OCV. Alternatively, another technique uses overlapping bins, but defines "keep-out" margins at the beginning and at the end of each timing bin. Signal transitions are scheduled only for the central portion of the bin between the keep out margins. The keep-out margins allow scheduled events at the center of the bin to move into these keep-out margins due to OCV without impacting adjacent timing bins.

Without accounting for current variation, each timing bin is filled up to a predetermined maximum amount of current. To account for current variations in the design, one method of the present invention fills a timing bin by no more than the predetermined maximum amount less a current $I_{OCV}$, where current $I_{OCV}$ represents the uncertainty or variance in the current estimation. Current uncertainty can be estimated using a variety of methods.

Further, one method may test the assignment of the MTCMOS cells under different process conditions to uncover any possible breach of a maximum current limit in a timing window under a plausible set of process conditions. Alternatively, another method provides a weighted estimated current based on a weighted sum of estimated currents under different process conditions. For example, if a logic cell may switch within any one of three adjacent timing windows with probabilities of ¼, ½ and ¼, due to different process conditions, the current contribution allocated to that logic cell may be the expected value of the estimated current under the different process conditions weighted by these probabilities.

Further optimization may be achieved by taking into account physical proximity of the switch cells and the logic cells. The timing analysis for assignment of logic cells to switch cells may take into consideration, for example, the expected routing lengths between the virtual ground and the logic cells and the expected amount of signal coupling to the virtual supply.

Upon completion of the MTCMOS logic cell assignments, each switch cell instance may be provided an initial size according to its current, so that the voltage drop across the switch cell due to its on-resistance is minimized (FIG. 7, step 704; also FIG. 2, step 208). In one embodiment, the sizing may be accomplished by choosing the smallest possible switch cell from the library without exceeding at that switch cell a user-specified maximum allowable voltage drop across the switch cell. Furthermore, the assignment of MTCMOS logic cell to the switch cells can be further optimized by requiring that no switch cell exceeds a maximum current for each timing window. This further optimization can be carried out in addition to minimizing the number of current events that can occur within a given timing window. In some instances, the maximum current per timing window per switch cell approach can be used instead of minimizing the number of current events in each window.

The above detailed description is provided to illustrate the specific embodiments of the present invention and is not intended to be limiting. Numerous modifications and variations within the scope of the present invention are possible. The present invention is set forth in the following claims.

I claim:

1. A method for optimizing a power-gated design, comprising:
   dividing a time period into a plurality of timing windows;
   mapping current events in each element of the power-gated design to one or more of the timing windows according to whether or not a current event of the element occurs within each timing window;
   providing a plurality of switch devices, each switch device having a first terminal coupled to a physical power supply, a second terminal coupled to provide a virtual power supply, and a third terminal receiving a control signal that enables a low impedance path between the first terminal and the second terminal; and
   assigning each element of the power-gated design to one of these switch devices according to the mapping of current events in each element to the timing windows.

2. A method as in claim 1, further comprising logically connecting the elements of the power-gated design to the switch devices according to the assignment of the assigning step.

3. A method as in claim 1, further comprising routing the elements of the power-gated design to the switch devices according to the assignment of the assigning step.

4. A method as in claim 1, wherein the number of current events associated with elements assigned to the switch device within each timing window is less than a predetermined number.

5. A method as in claim 4, wherein the predetermined number is one.

6. A method as in claim 1, wherein the assigning assigns elements to each switch device such that the switch device has a current less than a predetermined maximum in each timing window.

7. A method as in claim 1, wherein the mapping takes into account process variations.

8. A method as in claim 7, wherein the current events are derived from a weighted sum of estimated currents under different process conditions.

9. A method as in claim 7, further comprising checking for a violation of a current limit in each timing window under different process conditions.

10. A method as in claim 1, wherein the method is repeated for multiple asynchronous clock domains.

11. A method as in claim 1, wherein the assigning assigns elements to the switch device such that a voltage drop across the low impedance path is less than a predetermined value.

12. A method as in claim 1, wherein the assigning assigns elements to the switch device such that a voltage drop across a branch in a network of logic cells connected to a switch device is less than a predetermined value.

13. A method as in claim 1, wherein the assigning takes into consideration the routing lengths between the switch devices and the elements of the power-gated design.

14. A method as in claim 1, further comprising selecting the switch devices from a collection of switch devices each is handling a different maximum current.

15. A method as in claim 14, further comprising:
resizing selected ones of the switch devices;
modifying the assignments of elements to the switch devices such that the number of elements assigned to each switch device is increased.

16. A method as in claim 1, wherein the elements of the logic circuit and the switch devices comprise standard cells.

17. A method as in claim 16, wherein each standard cell includes a conductor at a predetermined location for routing the virtual power supply by abutment.

18. A method as in claim 1, wherein the elements of the logic circuit and the switch devices comprise transistors of different threshold voltages.

19. A method as in claim 1, further comprising estimating timing of the power-gated design, taking into consideration the switch devices.

20. A method as in claim 19, wherein the timing is estimated based on estimated wire impedances.

21. A method as in claim 19, wherein the timing is estimated using parasitic impedances extracted after the routing.

22. A method as in claim 1, wherein the current events are obtained using an event culling technique.

23. A method as in claim 1, wherein the current events are obtained using an event merging technique.

24. A method as in claim 1, wherein mapping the current events take into consideration timing variances.

25. A method as in claim 24, wherein each current event is mapped into a number of non-overlapping timing bins.

26. A method as in claim 25, wherein the number of non-overlapping timing bins mapped for each current event depends on the width of each timing bin and an uncertainty associated with each current event.

27. A method as in claim 24, wherein each current event is mapped into a central portion of one of a plurality of overlapping timing bins.

28. A system for optimizing a power-gated design within an integrated circuit design automation system, comprising:
a mapping module that analyzes current events in each element of the power-gated design and maps each current event to one or more timing windows according to whether or not the current event of the element occurs within each timing window, the timing windows being non-overlapping intervals of time within a predetermined time period in the power-gated design;
a switch device provisioning module that provides a plurality of switch devices in the power-gated device, each switch device having a first terminal coupled to a physical power supply, a second terminal coupled to provide a virtual power supply, and a third terminal receiving a control signal that enables a low impedance path between the first terminal and the second terminal; and
a switch device assignment module that associates each element of the power-gated design to one of these switch devices according to the mapping of current events in each element to the timing windows.

29. A system as in claim 28, further comprising a routing module that interconnects the elements of the power-gated design to the switch devices according to the element assignment of the switch devices.

30. A system as in claim 28, wherein the number of current events associated with elements assigned to the switch device within each timing window is less than a predetermined number.

31. A system as in claim 30, wherein the predetermined number is one.

32. A system as in claim 28, wherein the switch device assignment module assigns elements to each switch device such that the switch device has a current less than a predetermined maximum in each timing window.

33. A system as in claim 28, wherein the mapping module takes into account process variations.

34. A system as in claim 28, wherein the mapping module takes into account on-chip process variations.

35. A system as in claim 34, wherein the current events are derived from a weighted sum of estimated currents under different process conditions.

36. A system as in claim 28, wherein the mapping module checks for a violation of a current limit in each timing window under different process conditions.

37. A system as in claim 28, wherein the system is repeated for multiple asynchronous clock domains.

38. A system as in claim 28, wherein the switch device assignment module assigns elements to the switch device such that a voltage drop across the low impedance path is less than a predetermined value.

39. A system as in claim 28, wherein the switch device assignment module takes into consideration the routing lengths between the switch devices and the elements of the power-gated design.

40. A system as in claim 28, wherein the switch device assignment module assigns elements to the switch device such that a voltage drop across the low impedance path is less than a predetermined value.

41. A system as in claim 28, wherein the switch device provision module that selects from a collection of switch devices each is handling a different maximum current.

42. A system as in claim 41, wherein the switch device provisioning module resizes selected ones of the switch devices, and modifies the assignments of elements to the switch devices such that the number of elements assigned to each switch device is increased.

43. A system as in claim 28, wherein the elements of the logic circuit and the switch devices comprise standard cells.

44. A system as in claim 43, wherein each standard cell includes a conductor at a predetermined location for routing the virtual power supply by abutment.

45. A system as in claim 28, wherein the elements of the logic circuit and the switch devices comprise transistors of different threshold voltages.

46. A system as in claim 28, further comprising a timing module for estimating timing of the power-gated design, taking into consideration of the switch devices.

47. A system as in claim 46, wherein the timing is estimated based on estimated of wire impedances.

48. A system as in claim 46, wherein the timing is estimated using parasitic impedances extracted after the routing.

49. A method as in claim 22, wherein the current events are obtained using an event culling technique.

50. A method as in claim 22, wherein the current events are obtained using an event merging technique.

51. A method as in claim 22, wherein mapping the current events take into consideration timing variances.

52. A method as in claim 51, wherein each current event is mapped into a number of non-overlapping timing bins.

53. A method as in claim 52, wherein the number of non-overlapping timing bins mapped for each current event depends on the width of each timing bin and an uncertainty associated with each current event.

54. A method as in claim 51, wherein each current event is mapped into a central portion of one of a plurality of overlapping timing bins.

* * * * *